United States Patent

Carlson

[11] Patent Number: 6,166,356
[45] Date of Patent: Dec. 26, 2000

[54] TEMPERATURE MONITORING SYSTEM

[75] Inventor: Gerard J. Carlson, Boise, Id.

[73] Assignee: Hewlett-Packard, Palo Alto, Calif.

[21] Appl. No.: 09/294,835

[22] Filed: Apr. 19, 1999

[51] Int. Cl.[7] .............................. H05B 1/02; G01N 30/96
[52] U.S. Cl. ............................................. 219/497; 422/88
[58] Field of Search .................................... 219/490, 494, 219/497, 505, 509, 510; 422/83, 88, 89, 90, 98; 73/23.2, 23.21, 23.25; 205/785, 785.5; 204/424, 430, 431

[56] References Cited

U.S. PATENT DOCUMENTS

| | | | |
|---|---|---|---|
| 3,932,807 | 1/1976 | Wilson | 324/71.1 |
| 4,185,491 | 1/1980 | Owen | 73/31.03 |
| 4,450,723 | 5/1984 | Scott | 73/73 |
| 4,992,384 | 2/1991 | Laurs et al. | 422/88 |
| 5,573,728 | 11/1996 | Loesch et al. | 422/90 |

*Primary Examiner*—Sang Paik
*Attorney, Agent, or Firm*—Gregg W. Wisdom

[57] ABSTRACT

An embodiment of a temperature monitoring system can be used to determine the temperatures of assemblies in an apparatus. The embodiment of the temperature monitoring system includes a sensor that can measure different types of gaseous molecules. The embodiment of the temperature monitoring system further includes a monitoring device coupled to the sensor to generate parameters based upon the quantities of the different types of gaseous molecules emitted by the assemblies. A controller coupled to the monitoring device determines the temperatures of the assemblies using the parameters generated by the monitoring device. If the controller determines that the temperatures of one or more of the assemblies exceeds a maximum desired operating temperature, the controller reduces the amount of energy dissipated in the assemblies to reduce the temperatures of the assemblies.

22 Claims, 2 Drawing Sheets

TEMPERATURE MONITORING SYSTEM

FIELD OF THE INVENTION

This invention relates to the determination of temperature. More particularly, this invention relates to the determination of the temperature of assemblies in an apparatus.

BACKGROUND OF THE INVENTION

Many different types of apparatuses include assemblies that dissipate energy or are otherwise heated. An ongoing concern in the operation of these apparatuses is in ensuring that the temperature of these assemblies is maintained within a proper operating range. If the temperatures rise above the proper operating range, damage may occur to the apparatuses or, in extreme cases, a fire hazard may result. In addition to the possibility of damage or fire, temperatures outside of the proper operating range may result in the emission of toxic fumes or annoying odors. A need exists for inexpensive temperature monitoring of these assemblies to determine when the operating temperatures are outside of the proper range.

SUMMARY OF THE INVENTION

Accordingly, a system for monitoring a temperature of a first assembly in an apparatus includes a sensor to measure a quantity of a first type of gaseous molecule emitted from the first assembly. The system further includes a monitoring device coupled to the sensor and configured to generate a first parameter related to the temperature of the first assembly and based upon measurement of the quantity of the first type of gaseous molecule by the sensor.

In an apparatus including a first assembly, a method for monitoring energy dissipation in the apparatus includes measuring a quantity of a first type of gaseous molecule emitted from the first assembly. The method further includes generating a first parameter related to a temperature of the first assembly and based upon measurement of the quantity of the first type of gaseous molecule.

An apparatus includes a first assembly that can emit a first type of gaseous molecule. The apparatus further includes a sensor configured to measure a quantity of the first type of gaseous molecule. Additionally, the apparatus includes a monitoring device coupled to the sensor and configured to generate a first parameter related to a temperature of the first assembly and based upon measurement of the quantity of the first type of gaseous molecule by the sensor. The apparatus also includes a controller coupled to the monitoring device and configured to determine the temperature of the first assembly using the first parameter.

DESCRIPTION OF THE DRAWINGS

A more thorough understanding of the invention may be had from the consideration of the following detailed description taken in conjunction with the accompanying drawings in which.

DETAILED DESCRIPTION OF THE DRAWINGS

The present invention is not limited to the specific exemplary embodiments illustrated in this specification. Although the embodiments of the temperature monitoring system will be discussed in the context of an apparatus having generic assemblies, it should be recognized that the temperature monitoring system is particularly well suited for use in electronic apparatuses such as computers, data storage systems, printers, or the like. Typically, these kinds of apparatuses include a variety of assemblies such as, integrated circuits, power supplies, transformers, motors, or power semi-conductors, for which maintaining an operating temperature within a certain range is important for proper performance and reliability.

Assemblies within an apparatus very often contain materials having organic chemical compounds in them. These materials include, for example, plastics, epoxy, lacquer, enamels, or lubricants. When these assemblies dissipate energy in the form of heat, there is an ensuing temperature rise resulting in the vaporization of some of the organic molecules in these materials into gaseous molecules. The heat causing the vaporization may originate from the conversion of energy within the assembly to heat or from a source of energy external to the assembly causing the dissipation of energy within the assembly. Because the amount of vaporization that occurs is related to temperature, the quantity of gaseous molecules that are emitted by the assembly can be used to indicate the temperature of the assembly. Additionally, the type of emitted gaseous molecules could also indicate temperature. Organic molecules in the assemblies can be chemically modified by the application of sufficiently high temperatures. The presence of these chemically modified organic molecules indicates that the assemblies have reached a temperature necessary for chemical modification to occur. Measurement of these chemically modified organic molecules (after becoming gaseous molecules) provides another way to determine the temperature of the assembly.

Plastic integrated circuit packages provide an example of the relation between the quantity of gaseous molecules and temperature. Plastic packages of integrated circuits contain epoxies that, when heated, will emit gaseous molecules. The relationship between the quantity of gaseous molecules emitted and the temperature can be empirically determined so that information about the quantity of gaseous molecules measured can be used to determine the temperature of the integrated circuit that emitted the gaseous molecules. It should be recognized that although gaseous molecules are most likely formed from organic molecules, it is possible that certain types of apparatuses can emit gaseous molecules formed from inorganic molecules.

Figure 1:
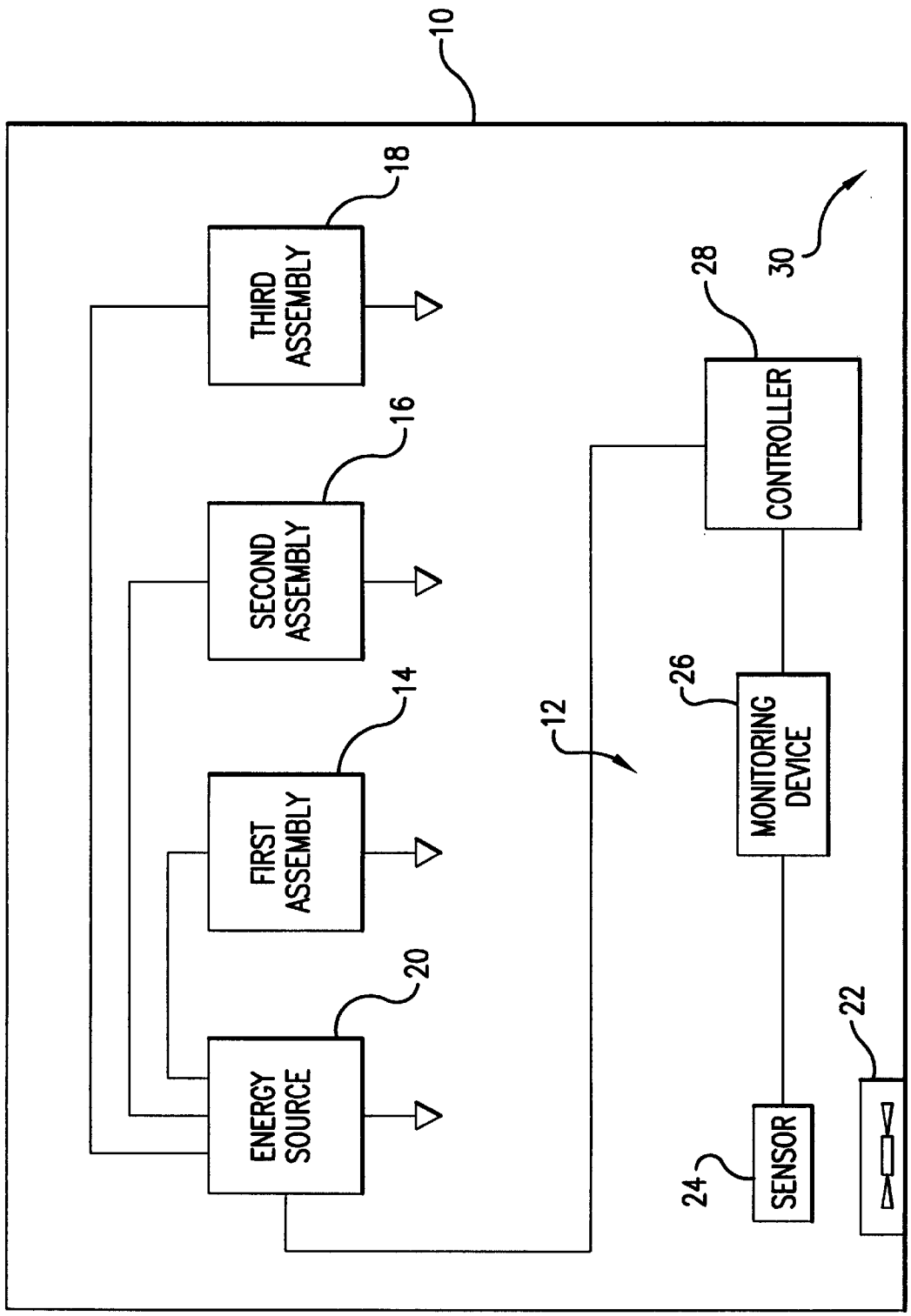
FIG. 1 shows a high level block diagram of an apparatus including an embodiment of the temperature monitoring system.

Shown in FIG. 1 is a high level block diagram of an apparatus 10 including an embodiment of the temperature monitoring system, temperature monitoring system 12. In apparatus 10, a first assembly 14, a second assembly 16, and a third assembly 18 are each coupled to an energy source 20. First assembly 14, second assembly 1 6, and third assembly 18 could include such things as a microprocessor, switching power supply, disk drive, electric motor, or the like. Energy source 20 could include an AC power source or a DC power source. The embodiment of energy source 20 included in apparatus 1 0 includes the capability to reduce the energy supplied to one or more of first assembly 14, second assembly 1 6, and third assembly 1 8 if an undesirable temperature condition in the assemblies occurs. Apparatus 10 further includes a cooling device, such as fan 22.

Temperature monitoring system 1 2 includes a sensor 24 and a monitoring device 26 coupled to sensor 24. Monitoring device 26 generates one or more parameters related to the temperature of the assemblies using sensor 24. A controller 28 is coupled to monitoring device 26 and energy source 20. Controller 28 is configured to receive the parameters from monitoring device 26. Controller 28 analyzes the parameters received from monitoring device 26 and determines if sensor 24 has measured quantities of gaseous molecules corresponding to a temperature condition in any of the assemblies that is above the desired range. If controller 28 determines that an undesirable temperature condition exists in one or more of the assemblies, then controller 28 can adjust energy source 20 to reduce the energy supplied to the assemblies having the undesirable temperature conditions. If controller 28 determines that hazardous temperatures exist on any of the assemblies or in energy source 20, controller 28 can interrupt the supply of energy to the assemblies having the hazardous temperatures.

In the temperature monitoring system 12 shown in FIG. 1, sensor 24 is located in the air stream generated by fan 22. Fan 22 draws air through apparatus 10 to cool first assembly 14, second assembly 16, third assembly 18, and energy source 20. The air is exhausted from apparatus 10 through fan 22. By locating sensor 24 near the fan 22, sensor 24 can more effectively measure the gaseous molecules emitted within the entire volume of apparatus 10 than if sensor 24 was located outside of the air stream near fan 22. For example, if sensor 24 was located in corner 30 of apparatus 1 0, then it would not be exposed to the same level of airflow. Therefore, it would be less likely that sensor 24 would measure all of the types of gaseous molecules emitted within apparatus 10. The air stream generated by fan 22 pulls air from throughout the interior of apparatus 10. Thus, by locating sensor 24 in the air stream generated near fan 22, sensor 24 samples air from any location from which air is pulled to form the air stream. Although it is preferable to locate sensor 24 within the air stream near fan 22, the temperature monitoring system 12 shown in FIG. 1 could be located elsewhere and still effectively measure gaseous molecules emitted within apparatus 10.

It should be recognized that principles associated with the operation of apparatus 10 are applicable for other types of apparatuses. For example, apparatuses containing only mechanical assemblies, such as hydraulic motors or gear drive assemblies could use an embodiment of the temperature monitoring system to measure gaseous molecules emitted by the heating of the hydraulic motors or gear drive assemblies. For this application, the embodiment of the temperature monitoring system would most likely have to measure the emission of gaseous molecules coming from lubricants. Another possible application of an embodiment of the temperature monitoring system is in electrophotographic imaging systems, such as printers or copiers. Electrophotographic imaging systems use fixing devices to fix toner to media by applying heat to the media. Scorching of the media by the fixing device could present a fire hazard. An embodiment of the temperature monitoring system could be used to detect scorching and control the fixing temperature to prevent the scorching.

Another useful application of an embodiment of the temperature monitoring system in an electrophotographic imaging system is in the fixing of toner to overhead transparencies. Some overhead transparencies contain substances that generate noxious and/or offensive odors when subjected to the nominal operating temperature of a fixing device. The emission of these odors could be reduced by reducing the energy supplied to the fixing device so that the fixing of toner occurs at a lower temperature for a longer period of time. The embodiment of the temperature monitoring system would detect the emission of gaseous molecules from the substances in the overhead transparencies. In response to the detection of the gaseous molecules, the energy supplied by the energy source to the fixing device would be reduced. Furthermore, the rate at which the overhead transparency is moved through the fixing device would be reduced.

Sensor 24 includes the capability to measure quantities of gaseous molecules present in the air stream. There are several types of devices that can be used in sensor 24 to accomplish this function. The particular type of device selected for sensor 24 is not critical as long as it has the capability to measure quantities of gaseous molecules. Sensor 24 could make use of a conductive polymer element designed to absorb a particular type of gaseous molecules. In response to the absorption of the gaseous molecules, the resistance of the conductive polymer element changes. If sensor 24 includes a conductive polymer, monitoring device 26 would include the necessary hardware to measure a change in resistance of the conductive polymer element. For example, monitoring device 26 could use an op amp integrator supplied by a controllable current source to generate a voltage across a capacitor dependent on the resistance of the conductive polymer element. The integrator could be used to measure small changes in the resistance of the conductive polymer element (resulting from the absorption of gaseous molecules) by appropriately selecting the magnitude of the current provided by the current source and the integration time period. If sensor 24 needed the capability to measure a variety of quantities of different types of gaseous molecules, multiple conductive polymer elements, corresponding to each of the types of gaseous molecules to be measured, could be used. Alternatively, a resistance bridge could be used to measure small changes in the resistance of the conductive polymer element. In yet another alternative, a lossy integrator could be used to generate a running average of a parameter (such as voltage) related to the resistance of the conductive polymer element.

Another type of device that could be used in sensor 24 includes a quartz microbalance sensor that experiences a change in resonant frequency with the absorption of gaseous molecules. Yet another type of device that could be used in sensor 24 includes metal oxide sensor that chemically interacts with gaseous molecules. Additional detail about devices that could be used to measure quantities of gaseous molecules can be found in the article entitled "*E-noses Nose out Traditional Odor-detection Eqiuipment*", Electronic Design News, Dec. 17, 1998, incorporated by reference into this specification in its entirety.

Monitoring device 26 includes a configuration to generate one or more parameters related to the measurement of quantities of one or more types of gaseous molecules. The parameters vary based upon the quantities of the particular types of gaseous molecules emitted within apparatus 10 and measured by sensor 24. Because the quantities of the gaseous molecules emitted from apparatus 10 are dependent on the temperatures of the assemblies within it, the parameters indicate the temperatures of the assemblies within apparatus 10. Consider an embodiment of sensor 24 using conductive polymer elements and an embodiment of monitoring device 26 using current sources and integrators to generate voltages related to the resistance of the conductive polymer elements. Each of the conductive polymer elements could correspond to a particular type of gaseous molecule emitted by an assembly in apparatus 10. The voltages (corresponding to each of the conductive polymer elements) generated by monitoring device 26 indicate the temperatures of the assemblies within apparatus 10. As the temperature of the assemblies in apparatus 10 increases, the quantities of the types of gaseous molecules increases. As a result, the absorption of gaseous molecules into the conductive polymer elements increases, changing the resistance of the elements and changing the voltages generated by monitoring device 26. For this embodiment of monitoring device 26, the parameters correspond to voltages generated by monitoring device 26.

Controller 28 is configured to receive the voltages generated by monitoring device 26. Controller 28 includes a configuration to access empirically derived lookup tables that relate the voltages generated by monitoring device 26 to the temperatures of the assemblies in apparatus 10. The lookup tables could be stored in controller 28 or in an external memory device. Using these lookup tables, controller 28 can determine the temperatures of the assemblies in apparatus 10 by selecting the lookup table temperatures corresponding to the voltages. If controller 28 determines that the temperatures of any of the first assembly 14, second assembly 16, or third assembly 1 8 are above a desired maximum level, then controller 28 can adjust energy source 20 to reduce the energy supplied to the assembly and reduce its temperature. If the temperature monitoring system was used in an apparatus including mechanical assemblies, controller 28 could cause an interruption in the mechanical energy delivered (for example, disconnecting a drive shaft) to the mechanical assemblies.

The temperature monitoring system can be used in several ways to improve the reliability and safety of an apparatus. The temperatures of the assemblies could be monitored to determine when an assembly has exceeded it maximum operating temperature and requires repair or replacement. In this mode, the temperature monitoring system would monitor the temperature of the assemblies and report over temperature conditions. Alternatively, the temperatures of assemblies could be monitored to prevent a damaging temperature rise in the assemblies. In this mode, the temperature monitoring system reduces the energy supplied to the assemblies to prevent failure.

Instead of relying upon the emission of gaseous molecules that arise from substances that happen to be included in materials used to construct the assemblies, substances may be specifically added to the assemblies to generate specific types of gaseous molecules. Substances may be added by applying them onto the surface of assemblies. Alternatively, the substances that can generate specific types of gaseous molecules can be added by combining them with other materials used in constructing the assemblies. For example, the electrical insulation used in an assembly could contain additives that would generate the specific types of gaseous molecules. There are many possible substances, such as high molecular weight hydrocarbons, or other organic compounds, that would be suitable. An important characteristic is that the substance itself does not present a fire hazard in the quantities used. Another important characteristic of the substance is that it has a predictable temperature dependent vaporization. Those substances that have higher volatility would be better suited for assemblies normally operating at lower temperatures, while those substances with lower volatility would be better suited for assemblies normally operating at higher temperatures.

Adding substances having known vaporization characteristics to the assemblies has several potential advantages over relying upon substances that happen to be within the materials forming the assemblies to generate the gaseous molecules. A substance can be selected to have vaporization characteristics matched to the operating temperature of the assembly to which it will be added. This would help prevent loss of the ability to measure a temperature rise over time due to an ongoing low level vaporization that may deplete the amount of the substance available for vaporization in an assembly. It would also reduce a loss in the accuracy of determining the temperature because of shifts that may in the temperature vaporization characteristics over time for substances within the assemblies. Additionally, because the temperature-vaporization characteristics could be controlled by selection of the substance and the substance could be added in repeatable amounts to the assembly, the accuracy of the temperature measurement of the assembly could be improved. Furthermore, the sensors used to measure quantities of the types of gaseous molecules and the substance selected could be closely matched to reduce the erroneous measurement of quantities of other types of gaseous molecules emitted from other assemblies.

Yet another advantage of using added substances is the ability to reduce the number of different gaseous molecules that sensor 24 must measure to determine the temperature of a given number of assemblies. Consider the case in which sensor 24 includes a configuration to measure quantities of gaseous molecules emitted from three types of added substances. By adding the various combinations possible of the three substances to the assemblies, the temperature of up to seven different assemblies could be measured. One of the assemblies would have all three substances added, three of the assemblies would each have one of the three possible combinations of two of the substances added, and the remaining three assemblies would each have one of the three substances added.

It may be difficult to distinguish between the case in which more than one assembly, each having a single substance added, experience an over temperature condition close in time and the case in which a single assembly, having multiple substances added, experiences an over temperature condition. Because it is unlikely that more than one assembly will experience an over temperature condition close in time, measuring the time difference between the instances at which the different types of gaseous molecules are first measured can assist in differentiating between these cases. If different types of gaseous molecules are measured substantially simultaneously, this indicates that a single assembly, having multiple substances added, is likely experiencing an over temperature condition. If there is a significant time delay between the instances at which the different types of gaseous molecules are first measured, this indicates that more than one assembly is likely experiencing an over temperature condition.

The temperature monitoring system provides several advantages over previous attempts at detecting over temperature conditions on assemblies. Devices, such as smoke detectors, generally detect the presence or absence of gaseous molecules after damage has been done to the assembly emitting the gaseous molecule. However, the temperature monitoring system can detect an over temperature condition before damage to the assembly has occurred. Electronic temperature sensors generally must be located close to or in contact with the assembly in order to detect an over temperature condition of the assembly. With the temperature monitoring system, a single sensor, not in contact with the assemblies, can detect an over temperature condition in multiple assemblies. Mechanical stall indicators are not suitable for detecting over temperature conditions in electrical devices. The temperature monitoring system can detect an over temperature condition in electrical assemblies, mechanical assemblies, or other materials located inside of an apparatus. Protection devices, such as circuit breakers or fusible links are generally not self resetting. However, with the temperature monitoring system once the emission of gaseous molecules stops, convection removes the emitted gaseous molecules from the sensor and the over temperature condition is no longer detected.

Figure 2:
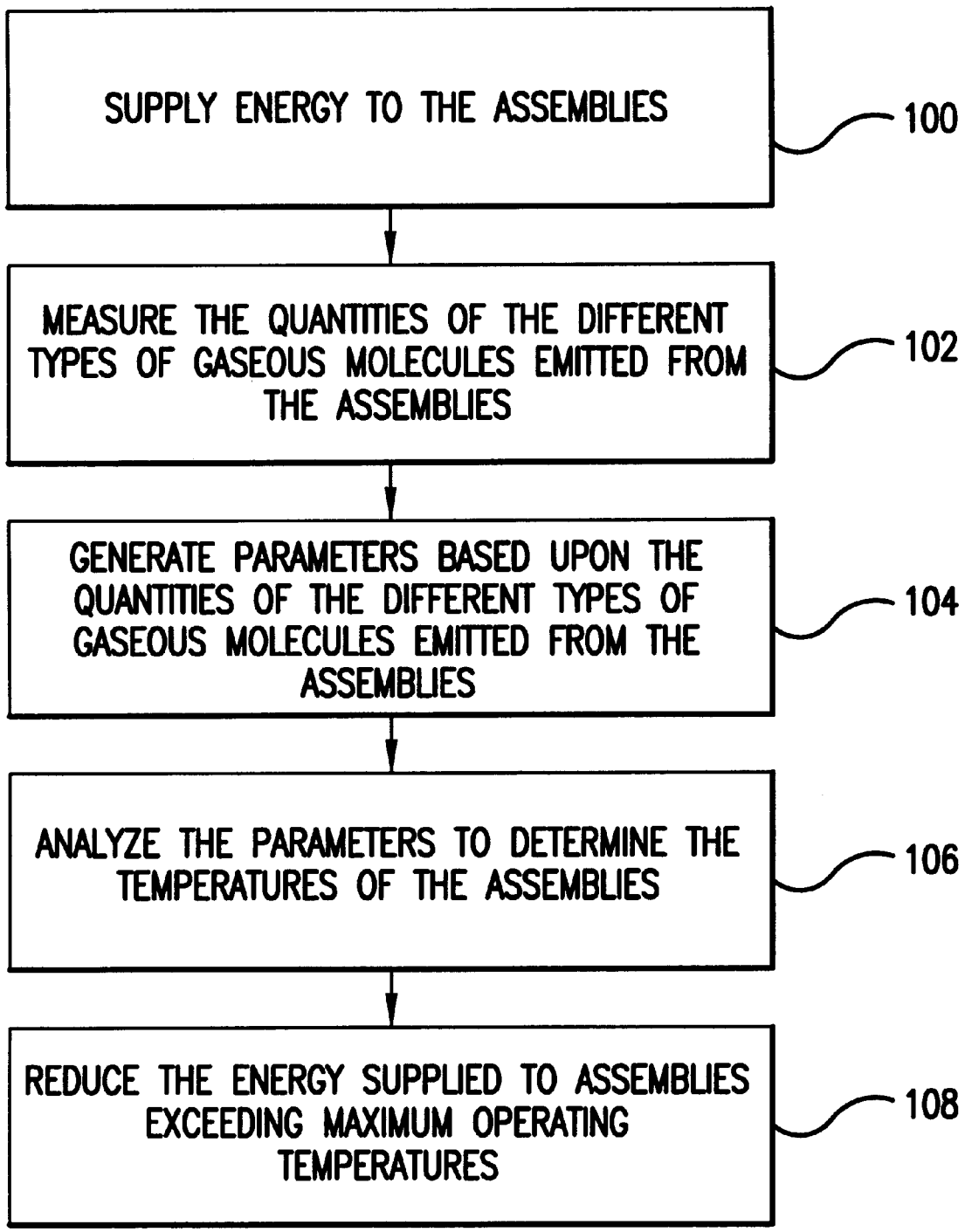
FIG. 2 shows a high level flow diagram of a method for using the embodiment of the system for the temperature monitoring system shown in FIG. 1.

Shown in FIG. 2 is a high level flow diagram of a method for using temperature monitoring system 12 to prevent an over temperature condition from occurring in first assembly 14, second assembly 16, and third assembly 18. First, in step 100, energy source 20 supplies energy to first assembly 14, second assembly 16, and third assembly 18. The energy supplied to each of the assemblies results in heating of the assemblies. Next, in step 102, sensor 24 measures the quantities of the different types of gaseous molecules emitted from each of the assemblies. Then, in step 104, monitoring device 26 generates parameters based upon the quantities of the different types of gaseous molecules emitted from each of the assemblies and related to the temperatures of each of the assemblies. Next, in step 106, controller 28 analyzes the parameters to determine the temperatures of the assemblies. Finally, in step 108, controller adjusts the energy source 20 to reduce the energy supplied to those assemblies exceeding a predetermined maximum operating temperature for each of the assemblies.

Although several embodiments of the invention have been illustrated, and their forms described, it is readily apparent to those of ordinary skill in the art that various modifications may be made to these embodiments without departing from the spirit of the invention or from the scope of the appended claims.

What is claimed is:

1. A system for monitoring a temperature of a first assembly in an apparatus, comprising:

a sensor to measure a quantity of a first type of gaseous molecule emitted from the first assembly; and a monitoring device coupled to the sensor and configured to generate a first parameter related to the temperature of the first assembly, with the first parameter based upon measurement of the quantity of the first type of gaseous molecule by the sensor.

2. The system as recited in claim 1, wherein:

a first substance included in the first assembly can emit the first type of gaseous molecule.

3. With the apparatus including a second assembly, the system as recited claim 2, wherein:

the sensor includes a configuration to measure a quantity of a second type of gaseous molecule emitted from the second assembly;

a second substance included in the second assembly can emit the second type of gaseous molecule; and the monitoring device includes a configuration to generate a second parameter related to a temperature of the second assembly and based upon measurement of the quantity of the second type of gaseous molecule by the sensor.

4. The system as recited in claim 1, wherein:

a first substance added to the first assembly can emit the first type of gaseous molecule.

5. With the apparatus including a second assembly, the system as recited claim 4, wherein:

the sensor includes a configuration to measure a quantity of a second type of gaseous molecule emitted from the second assembly;

a second substance added to the second assembly can emit the second type of gaseous molecule; and the monitoring device includes a configuration to generate a second parameter related to a temperature of the second assembly and based upon measurement of the quantity of the second type of gaseous molecule by the sensor.

6. The system as recited in claim 5, further comprising:

a controller coupled to the monitoring device and configured to determine the temperature of the first assembly using the first parameter and the temperature of the second assembly using the second parameter.

7. With the apparatus including a third assembly having the first substance and the second substance added to the third assembly, the system as recited in claim 6, wherein:

the first parameter and the second parameter relate to a temperature of the third assembly; and the controller includes a configuration to determine the temperature of the third assembly using the first parameter and the second parameter.

8. The system as recited in claim 7, further comprising:

an energy source coupled to the controller and configured to supply energy to the first assembly, the second assembly, and the third assembly, with the energy source for adjusting the energy supplied to at least one of the first assembly, the second assembly, and the third assembly based upon the controller determining which of the temperature of the first assembly, the temperature of the second assembly, and the temperature of the third assembly exceed, respectively, a first predetermined temperature, a second predetermined temperature, and a third predetermined temperature.

9. In an apparatus including a first assembly, a method for monitoring energy dissipation in the apparatus, comprising:

measuring a quality of a first type of gaseous molecule emitted from the first assembly; and generating a first parameter related to a temperature of the first assembly, with the first parameter based upon measurement of the quanity of the first type of gaseous molecule.

10. The method as recited claim 9, further comprising:

determining the temperature of the first assembly using the first parameter after generating the first parameter.

11. The method as recited in claim 10, further comprising:

adjusting the energy supplied to the first assembly based upon the temperature after determining the temperature.

12. The method as recited in claim 10, wherein:

a first substance included in the first assembly can emit the first type of gaseous molecule.

13. The method as recited in claim 10, further comprising:

adding a first substance to the first assembly before measuring the quantity of the first type of gaseous molecule.

14. With the apparatus including a second assembly, the method as recited in claim 13, further comprising:

measuring a quantity of a second type of gaseous molecule emitted from the second assembly; and generating a second parameter related to a temperature of the second assembly and based upon measurement of the quantity of the second type of gaseous molecule.

15. The method as recited in claim 14, further comprising:

adding a second substance to the second assembly before measuring the quantity of the second type of gaseous molecule.

16. The method as recited in claim 15, further comprising:

determining the temperature of the second assembly using the second parameter.

17. With the apparatus including a third assembly, the method as recited in claim 16, further comprising:

adding the first substance and the second substance to the third assembly; and determining a temperature of the third assembly using the first parameter and the second parameter with the first parameter and the second parameter relating to the temperature of the third assembly.

18. An apparatus, comprising:

a first assembly that can emit a first type of gaseous molecule;

a sensor configured to measure a quantity of the first type of gaseous molecule;

a monitoring device coupled to the sensor and configured to generate a first parameter related to a temperature of the first assembly, with the first parameter based upon measurement of the quantity of the first type of gaseous molecule by the sensor; and a controller coupled to the monitoring device and configured to determine the temperature of the first assembly using the first parameter.

19. The apparatus as recited in claim 18, further comprising:

an energy source coupled to the first assembly and the controller with the controller configured to adjust energy supplied by the energy source to the first assembly based upon the temperature.

20. The apparatus as recited in claim 18, wherein:

a first substance added to the first assembly can emit the first type of gaseous molecule.

21. The apparatus as recited in claim 20, further comprising:

a second assembly having a second substance added to the second assembly that can emit a second type of gaseous molecule; and a third assembly having the first substance and the second substance added to the third assembly.

22. The apparatus as recited in claim 21, wherein:

the sensor includes a configuration to measure a quantity of the second type of gaseous molecule;

the monitoring device includes a configuration to generate a second parameter related to a temperature of the second assembly and based upon measurement of the quantity of the second type of gaseous molecule by the sensor;

the first parameter and the second parameter relate to a temperature of the third assembly; and the controller includes a configuration to determine the temperature of the second assembly using the second parameter and to determine the temperature of the third assembly using the first parameter and the second parameter.

* * * * *

UNITED STATES PATENT AND TRADEMARK OFFICE
CERTIFICATE OF CORRECTION

PATENT NO.    : 6,166,356
DATED         : December 26, 2000
INVENTOR(S)   : Carlson Page 1 of 1

It is certified that error appears in the above-identified patent and that said Letters Patent is hereby corrected as shown below:

<u>Column 8,</u>
Line 33, delete "quality" and insert therefor -- quantity --.
Line 37, delete "quanity" and insert therefor -- quantity --.

Signed and Sealed this

Sixteenth Day of October, 2001

Attest:

*Nicholas P. Godici*

NICHOLAS P. GODICI
*Attesting Officer*   *Acting Director of the United States Patent and Trademark Office*